United States Patent
Djelassi et al.

(10) Patent No.: US 10,756,720 B2
(45) Date of Patent: Aug. 25, 2020

(54) DRIVER CIRCUIT FOR ELECTRONIC SWITCH

(71) Applicant: Infineon Technologies AG, Neubiberg (DE)

(72) Inventors: Christian Djelassi, Villach (AT); Octavian Barbu, Finkenstein (AT); Markus Ladurner, Villach (AT); Luca Petruzzi, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 955 days.

(21) Appl. No.: 15/295,903

(22) Filed: Oct. 17, 2016

(65) Prior Publication Data
US 2018/0109251 A1 Apr. 19, 2018

(51) Int. Cl.
| | |
|---|---|
| *H03K 17/081* | (2006.01) |
| *H01L 27/02* | (2006.01) |
| *H03K 17/687* | (2006.01) |
| *H03K 19/0185* | (2006.01) |
| *H03K 3/3565* | (2006.01) |
| *H03K 3/356* | (2006.01) |

(Continued)

(52) U.S. Cl.
CPC ... *H03K 17/08104* (2013.01); *H01L 27/0255* (2013.01); *H01L 27/0288* (2013.01); *H03K 3/3565* (2013.01); *H03K 3/356182* (2013.01); *H03K 17/6871* (2013.01); *H03K 19/018521* (2013.01); *H01L 28/20* (2013.01); *H01L 29/866* (2013.01)

(58) Field of Classification Search
CPC .... A61K 38/00; C07K 14/47; H01L 27/0255; H01L 27/0288; H01L 28/20; H01L 29/866; H03K 17/08104; H03K 17/6871; H03K 19/018521; H03K 3/356182; H03K 3/3565
See application file for complete search history.

(56) References Cited

U.S. PATENT DOCUMENTS

| | | | | |
|---|---|---|---|---|
| 5,671,115 A | * | 9/1997 | Streich ................... | H01H 47/10 361/154 |
| 6,529,050 B1 | * | 3/2003 | Kuo ................. | H03K 17/08122 326/83 |

(Continued)

OTHER PUBLICATIONS

"Power distribution for start-stop systems with a dual battery approach," Infineon, accessed on Mar. 31, 2017 from http://www.infineon.com/cms/en/applications/automotive/body-convenience/pdm/, 8 pp.

(Continued)

*Primary Examiner* — Jared Fureman
*Assistant Examiner* — Nicolas Bellido
(74) *Attorney, Agent, or Firm* — Shumaker & Sieffert, P.A.

(57) ABSTRACT

A driver circuit for an electronic switch is described herein. According to one embodiment the driver circuit includes an input buffer with an input node for receiving a buffer input signal, a pull-down circuit coupled to the input node and a ground node, and a pull-up circuit coupled to the input node and a supply node. The driver circuit further includes control circuitry configured to activate either the pull-down circuit or the pull-up circuit. The pull-up circuit is activated when the voltage level of the buffer input signal is above a first threshold, and the pull-down circuit is activated when the voltage level of the buffer input signal is below a second threshold.

21 Claims, 5 Drawing Sheets

(51) Int. Cl.
*H01L 49/02* (2006.01)
*H01L 29/866* (2006.01)

(56) References Cited

U.S. PATENT DOCUMENTS

| | | | | |
|---|---|---|---|---|
| 9,590,609 | B1* | 3/2017 | Musa | H03K 17/08122 |
| 2001/0040470 | A1* | 11/2001 | Brando | H03K 17/04206 |
| | | | | 327/109 |
| 2005/0218933 | A1* | 10/2005 | Linam | H03K 19/01852 |
| | | | | 326/83 |
| 2006/0050454 | A1* | 3/2006 | Koudate | H03K 19/018521 |
| | | | | 361/56 |
| 2009/0002054 | A1* | 1/2009 | Tsunoda | H03K 17/0406 |
| | | | | 327/374 |
| 2010/0254059 | A1 | 10/2010 | Higuchi et al. | |
| 2011/0241738 | A1* | 10/2011 | Tamaoka | H02M 1/08 |
| | | | | 327/109 |

OTHER PUBLICATIONS

"Smart High-side Switch Module (Triple 6.0 mOhm and Dual 17 mOhm," Freescale Semiconductor, Inc., Document No. MC06XS3517, Rev. 5.0, Apr. 2014, 41 pp.

LM26003-xx 3-A Switching Regulator with High Efficiency Sleep Mode, Texas Instruments, Aug. 2008, revised Feb. 2015, 32 pp.

"Power management," RADEL, accessed on Mar. 31, 2017, from http://radel.co.za/website/index.php?option=com_content&view=article&id=73:power-management&catid=34:e-t-a, 4 pp.

"Power management in on-board electrical systems of agricultural and construction machinery," E-T-A Circuit Protection & Control, accessed on Mar. 31, 2017, 12 pp.

"Blade Fuses," Littelfuse, littelfuse.com, accessed on Mar. 31, 2017, 1 pp.

"Energie-Backbone," accessed on Mar. 31, 2017, from https://forschungsstiftung.de/index.php/Projekte/Details/Energie-Backbone.html, 2 pp.

\* cited by examiner

DRIVER CIRCUIT FOR ELECTRONIC SWITCH

TECHNICAL FIELD

This disclosure in general relates to aspects of an electronic switching and protection circuit, and more particularly to a drive circuit for an electronic switch

BACKGROUND

Almost every electric installation (e.g. in an automobile, in a house, electric subsystems of larger installations) include one of more fuses to provide an over-current protection. Standard fuses include piece of wire, which provides a low-ohmic current path in case the current passing through the fuse is below a nominal current. However, the piece of wire is designed to heat up and melt or vaporize when the current passing through the fuse exceeds the nominal current for a specific time. Once triggered a fuse has to be replaced by a new one.

Fuses are increasingly replaced by circuit breakers. A circuit breaker is an automatically operated electrical switch designed to protect an electrical circuit from damage caused by overcurrent or overload or short circuit. Circuit breakers may include electro-mechanical relays, which are triggered to disconnect the protected circuit from the supply when an over-current (i.e. a current exceeding the nominal current) is detected. In many applications (e.g. in the on-board power supply of an automobile), circuit breakers may be implemented using an electronic switch (e.g. a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off Usually, the switching state (on/off) of electronic switches such as MOS transistors is controlled using so-called driver circuits or simply drivers (gate drivers in case of MOS transistors).

However, at least in some electronic circuit breakers (e-fuses) common driver circuits may be inadequate with regard to fault tolerance and functional safety, which may be an issue particularly in automotive applications, in which standards concerning functional safety must be complied with (e.g. ISO 26262).

SUMMARY

A driver circuit for an electronic switch is described herein. According to one embodiment the driver circuit includes an input buffer with an input node for receiving a buffer input signal, a pull-down circuit coupled to the input node and a ground node, and a pull-up circuit coupled to the input node and a supply node. The driver circuit further includes control circuitry configured to activate either the pull-down circuit or the pull-up circuit. The pull-up circuit is activated when the voltage level of the buffer input signal is above a first threshold, and the pull-down circuit is activated when the voltage level of the buffer input signal is below a second threshold.

Furthermore, a method for driving an electronic switch is described. In accordance with one embodiment, the method includes receiving a buffer input signal at an input node of an input buffer. The voltage level at an output node of the input buffer is pulled up by activating a pull-up circuit, when the voltage level of the buffer input signal is above a first threshold, or the voltage level at an output node of the input buffer is pulled down by activating a pull-down circuit, when the voltage level of the buffer input signal is below a second threshold.

Moreover, an electronic fuse circuit is described herein. According to one embodiment the electronic fuse circuit includes an electronic switch operably coupled to a load and configured to connect and disconnect the load from a power supply. Further, the electronic fuse circuit includes a driver circuit, which is coupled to a control electrode of the electronic switch. The driver circuit includes an input buffer comprising an input node for receiving a buffer input signal, a pull-down circuit coupled to the input node and a ground node, and a pull-up circuit coupled to the input node and a supply node. Further, the driver circuit includes control circuitry configured to activate either the pull-down circuit or the pull-up circuit. The pull-up circuit is activated when the voltage level of the buffer input signal is above a first threshold, and the pull-down circuit is activated when the voltage level of the buffer input signal is below a second threshold.

BRIEF DESCRIPTION OF THE DRAWINGS

The invention can be better understood with reference to the following description and drawings. The components in the figures are not necessarily to scale, emphasis instead being placed upon illustrating the principles of the invention. Moreover, in the figures, like reference numerals designate corresponding parts. In the drawings.

DETAILED DESCRIPTION

In the following detailed description, reference is made to the accompanying drawings. The drawings form a part of the description and by way of illustration show specific exemplary embodiments in which the invention may be practiced. It is to be understood that the features of the various embodiments described herein may be combined with each other, unless specifically noted otherwise.

Figure 1:
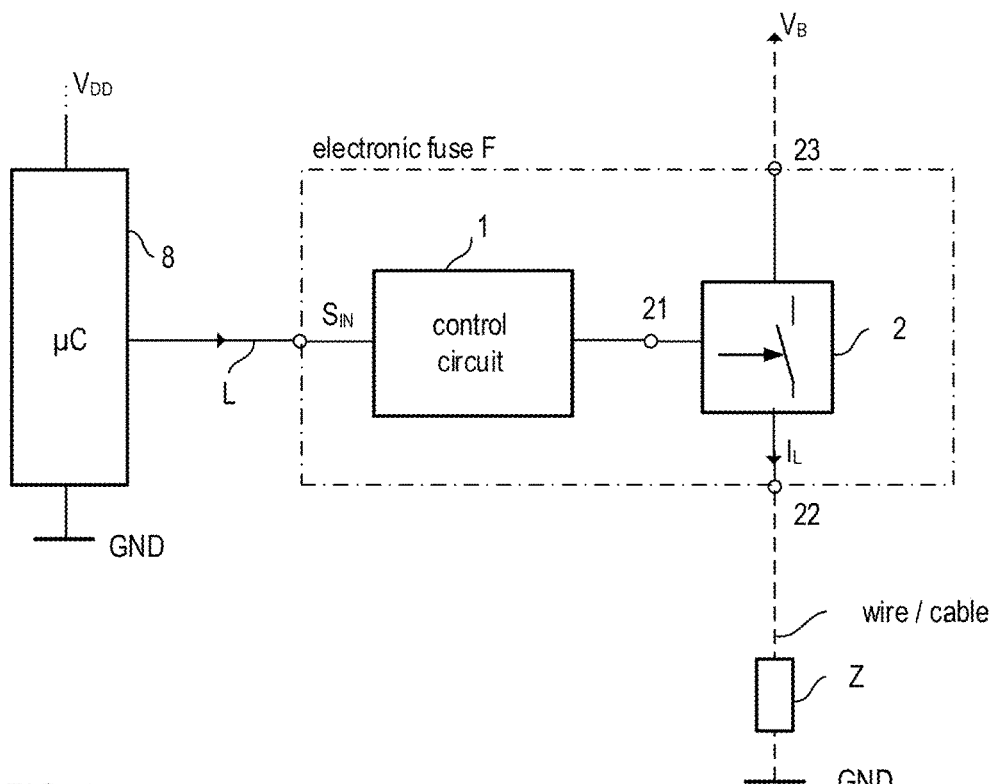
FIG. 1 schematically illustrates one exemplary application of an electronic circuit with an electronic switch and a control circuit configured to drive the electronic switch.

FIG. 1 illustrates one example of an electronic circuit, which may be operated as an electronic fuse F. The electronic circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic circuit with the electronic switch 2 and the control circuit 1 may be monolithically integrated on one semiconductor die (chip) or may be integrated in two semiconductor dies that are arranged in one integrated circuit package. The electronic circuit is configured to drive a load Z (illustrated in dashed lines in FIG. 1) that can be connected in series with the load current path of the electronic switch 2. Thereby, the series circuit of electronic switch 2 and load Z may be connected between supply nodes, at which a positive supply potential and a negative supply potential or ground potential GND (zero volts) may be provided. In the following, a voltage between the two supply nodes is referred to as supply voltage $V_B$. The load Z may be switched on and off in accordance with an input signal $S_{IN}$ supplied to the control circuit 1, for example, by a micro controller 8. However, dependent on the application the input signal $S_{IN}$ may be generated by any other circuitry instead of a micro controller.

In one exemplary application, the electronic circuit may be used to drive a load Z in an automobile. In this case, a power source that supplies the supply voltage $V_B$ is an automobile battery. "To drive a load" may include switching on or off the load by switching on or off the electronic switch 2. The load may be an arbitrary load used in an automobile. Examples of the load Z include, inter alia, different types of lamps, different types of motors, relays, a heating system, or the like. In the example illustrated in FIG. 1, the electronic switch 2 and the load Z are connected in a high-side configuration. That is, the load Z is connected between the electronic switch 2 and the ground node GND. This, however, is only an example. The electronic switch 2 and the load Z may also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire. Dependent on where the electronic circuit and the respective load Z are located within the electric installation of an automobile, the wire may have a considerable length of several 10 cm or even more (e.g. up to 10 m). A modern automobile includes a plurality of electric loads, so that a plurality of wires are required to connect the individual loads to their respective electronic switches. In order to save costs and resources, it may be desirable to dimension the individual wires such that on a long term they withstand a current corresponding to a nominal current of the respective load. If, however, the current rises above the nominal current, the wire may be damaged or even destroyed due to overheating. According to one exemplary embodiment, the control circuit 1 therefore has a function to monitor a load current $I_L$ through the electronic switch 2 and switch off the electronic switch 2 to protect the wire (and the load Z) when an overload scenario is detected. An "overload scenario" is a scenario that may result in the wire or the load being damaged or destroyed if the electronic switch 2 would not be switched off to disconnect the wire and the load from the power source providing the supply voltage $V_B$ (e.g. the automobile battery). This is explained in further detail herein below. As the electronic circuit is configured to switch on and off the load Z and to protect the wire, it is also referred to as switching and protection circuit in the following.

According to the example of FIG. 1, the electronic switch 2 is schematically drawn as a circuit block that includes a switch. In the following, the term "electronic switch" is meant to include any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state, in which the electronic switch 2 is capable of conducting a current between the first load node 22 and the second load node 23. "Switched off" means that the electronic switch 2 is operated in an off-state, in which the electronic switch 2 is capable of preventing a current flow between the first load node 22 and the second load node 23. According to one example, the electronic switch 2 includes at least one transistor. The at least one transistor is, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, it is also possible that the functions of the individual functional blocks are performed by a programmable circuit (processor), which is configured to execute software stored in a memory.

Figure 2:
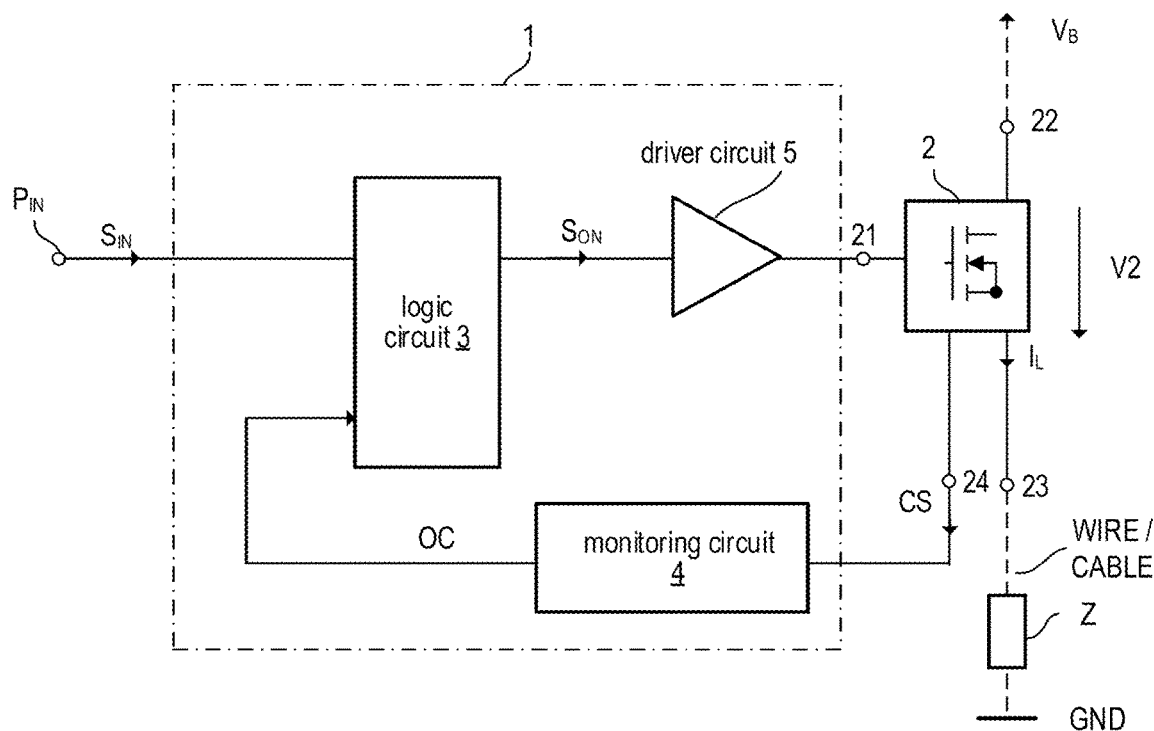
FIG. 2 shows one exemplary implementation of the control circuit.

FIG. 2 illustrates one exemplary implementation of the control circuit 1. In this example, the control circuit 1 includes a monitoring circuit 4 configured to generate a first protection signal OC based on a current-time-characteristic of the load current $I_L$. "To generate the first protection signal OC based on the current-time-characteristic of the load current $I_L$" may include that the monitoring circuit 4 considers the current level of the load current $I_L$ as well as the previous current level to generate the first protection signal OC. That is, the monitoring circuit 4 evaluates the load current $I_L$ over a certain time period in order to generate the first protection signal OC. To be able to evaluate the load current $I_L$ the monitoring circuit 4 receives a current measurement signal CS and generates the first protection signal OC based on the current measurement signal CS. The current measurement signal CS represents the load current $I_L$ and, according to one example, may be proportional to the load current $I_L$. In the example of FIG. 2, the current measurement signal CS (which may also be referred to as current sense signal) is available at a sense output 24 of the electronic switch 2. In this case, a current measurement circuit configured to measure the load current $I_L$ and provide the current measurement signal CS may be integrated in the electronic switch 2. However, this is only an example. A current measurement circuit separate from the electronic switch 2 may be used as well.

The control circuit 1 illustrated in FIG. 2 is configured to drive the electronic switch 2 based on the first protection signal OC and an input signal $S_{IN}$ received at a first input node (input pin) $P_{IN}$ of the electronic circuit. The first protection signal OC as well as the input signal $S_{IN}$ are supplied to a logic circuit 3, which generates a drive signal $S_{ON}$ based on the first protection signal OC and the input signal $S_{IN}$. The drive signal $S_{ON}$ is supplied to the control node 21 of the electronic switch 2 in order to switch on or off the electronic switch 2. According to one example, the drive signal $S_{ON}$ may be a logic signal that has an on-level indicating that it is desired to switch on the electronic switch 2 or an off-level indicating that it is desired to switch off the electronic switch 2. The driver circuit 5 (or simply driver) is configured to drive the electronic switch 2 based on the respective signal level of the drive signal $S_{ON}$. The electronic switch 2, for example, includes a transistor, such as a MOSFET (as schematically illustrated in FIG. 2). A MOSFET is a voltage controlled semiconductor device that switches on or off dependent on a drive voltage applied between a gate node and a source node. In this example, the driver circuit 5 is configured to generate the drive voltage (gate voltage) based on the drive signal $S_{ON}$ in order to switch on or off the MOSFET in accordance with the drive signal $S_{ON}$.

Figure 3:
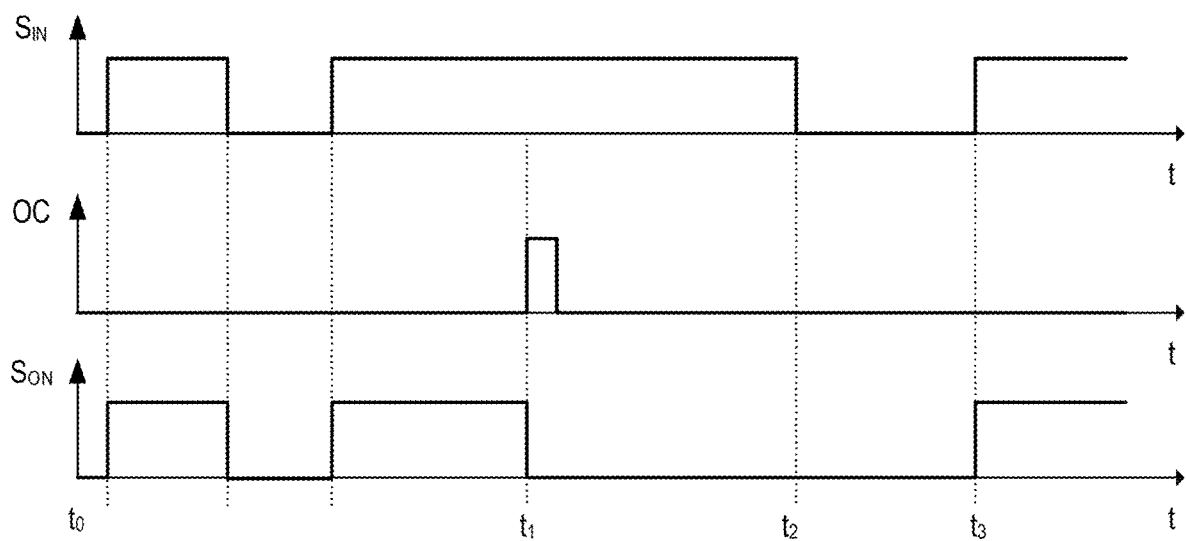
FIG. 3 includes timing diagrams illustrating one example of operation of a logic circuit included in the control circuit shown in FIG. 2.

One way of operation of the control circuit 1, in particular of the logic circuit 3, is explained with reference to FIG. 3. FIG. 3 includes exemplary timing diagrams of the input signal $S_{IN}$, the first protection signal OC, and the drive signal $S_{ON}$. In the depicted example, the input signal $S_{IN}$ is a logic signal that has an on-level or an off-level. As mentioned, an on-level of the input signal $S_{IN}$ indicates that it is desired to switch on the electronic switch 2, and an off-level indicates that it is desired to switch off the electronic switch 2. Just for the purpose of explanation, the on-level may be a high logic level and the off-level may be a low logic level in this example. Likewise, the on-level of the drive signal $S_{ON}$ is illustrated as a high level and the off-level is illustrated as a low level in the example of FIG. 3. In this example, the first protection signal OC is also a logic signal with two different signal levels. A signal level of the first protection signal OC indicating that it is desired to switch off the electronic switch 2, is referred to as protection level or disable level (as it disables the logic circuit 3 to switch off the electronic switch 2) in the following. The protection level may be a high logic level according to the example shown in FIG. 3. The other signal level of the first protection signal OC is referred to as enable level (as it enables the logic circuit 3 to drive the electronic switch 2 based on the input signal $S_{IN}$) in the following. The enable level may be a low signal level according to the present example.

As illustrated in FIG. 3, the logic circuit 3 is configured to drive the electronic switch 2 in accordance with the input signal $S_{IN}$ if the first protection signal OC has the enable level. That is, the logic circuit 3 switches on the electronic switch 2 when the signal level of the input signal $S_{IN}$ changes from the off-level to the on-level by generating the drive signal $S_{ON}$ with an on-level, and switches off the electronic switch 3 when the signal level of the input signal $S_{IN}$ changes from the on-level to the off-level by generating the drive signal $S_{ON}$ with an off-level This scheme is illustrated in FIG. 3 between time instants $t_0$ and $t_1$. The logic circuit 3 switches off the electronic switch 2 by changing the signal level of the drive signal $S_{ON}$ from the on-level to the off-level when the first protection signal OC indicates that it is desired to switch off the electronic switch 3. This is shown in FIG. 3 at time instant $t_1$ when the signal level of the first protection signal OC changes to the protection level.

According to one example, the logic circuit 3 maintains the electronic switch 2 in the off-state even if the first protection signal OC changes to the enable level and the input signal $S_{IN}$ has the on-level after time $t_1$. That is, the logic circuit 3 is locked in an operation state that maintains the electronic switch 2 in the off-state until it is reset. According to one example, the logic circuit 3 is configured to again switch on the electronic switch 2, that is, to reset the logic circuit 3, only after the signal level of the input signal $S_{IN}$ has changed from the on-level to the off-level and back from the off-level to the on-level. In the example shown, the signal level of the input signal $S_{IN}$ changes to the off-level at time instant $t_2$ and back to the on-level at time instant $t_3$, wherein the electronic switch 2 is again switched on at time instance $t_3$. According to one example, the logic circuit 3 is reset only if the off-level of the input signal $S_{IN}$ prevails for longer than a predefined time period before the input signal $S_{IN}$ changes to the on-level. That is, in the example shown in FIG. 3, the drive circuit is reset only if there is the predefined time period between time instances $t_2$ and $t_3$.

Figure 4:
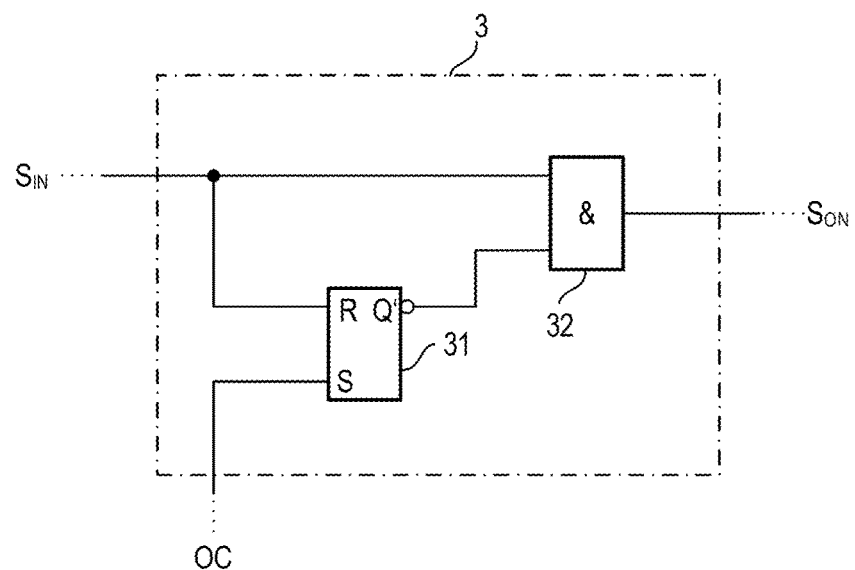
FIG. 4 shows one exemplary implementation of the logic circuit.

FIG. 4 shows one example of a logic circuit 3 configured to drive the electronic switch 2 in accordance with the timing diagrams shown in FIG. 3. In this example, the logic circuit 3 includes a latch 31, for example, an SR flip-flop and a logic gate 32, for example, an AND gate. The SR flip-flop receives the first protection signal OC at a set input S, and the logic gate receives the input signal $S_{IN}$ and an output signal from an inverting output Q' of the flip flop 31. The input signal $S_{IN}$ is received by a reset input R of the flip-flop 31. The flip flop 31 is set when the protection signal OC changes from the enable level to the disable level (protection level) and is not reset until the input signal $S_{IN}$ changes from the off-level to the on-level. When the flip-flop 31 is set, it changes the signal level of the drive signal $S_{ON}$ to the off-level via the logic gate 32 until the flip-flop is reset. After the flip-flop 31 has been reset, the drive signal $S_{ON}$ is again governed by the input signal $S_{IN}$ until the flip-flop 31 is set again.

Figure 5:
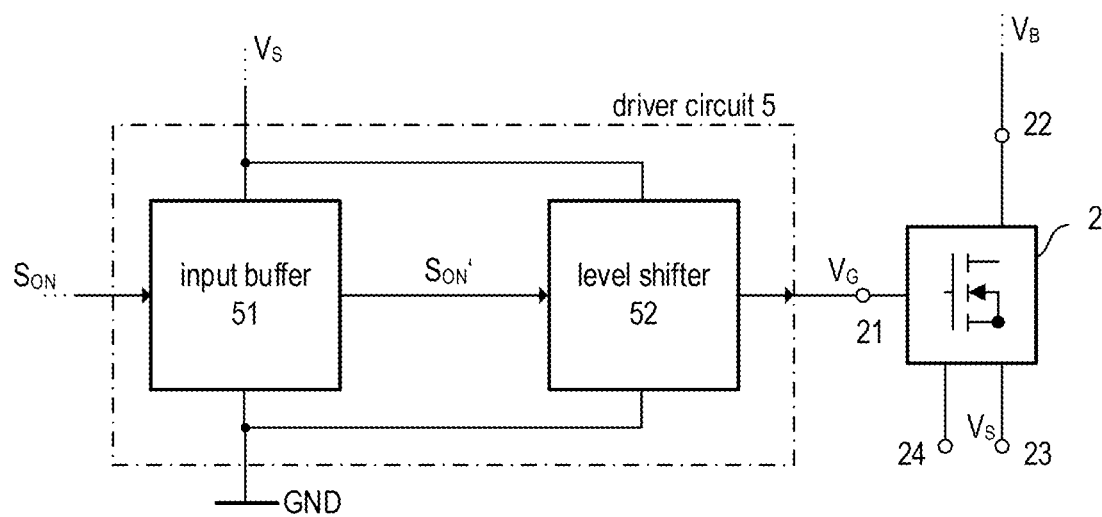
FIG. 5 shows the driver circuit included in the control circuit for driving the electronic switch in more detail; the driver circuit having an input buffer and a level shifter.

The signal $S_{ON}$ output by the logic circuit is a single ended binary (boolean) signal, which indicates the desired switching state (on or off) of the electronic switch 2. However, as the switch is operated as an electronic fuse it will usually be connected between the power supply $V_B$ and the load Z (see FIG. 1) and thus the electronic switch will generally be a high-side switch. Therefore, the driver circuit 5 (see FIG. 2) is composed of an input buffer 51 and a level shifter 52 as illustrated in FIG. 5. The input buffer 51 may include some over-voltage protection circuitry and is configured to provide a signal $S_{ON}'$ with defined high and low levels to the level shifter 52. The level shifter 52 is configured to translate the signal $S_{ON}'$ into a drive voltage $V_G$ for the electronic switch 2, wherein the signal $S_{ON}'$ has ground as reference while the drive voltage has a floating reference (e.g. the source potential of the electronic switch 2 in case of a MOS transistor).

Figure 6:
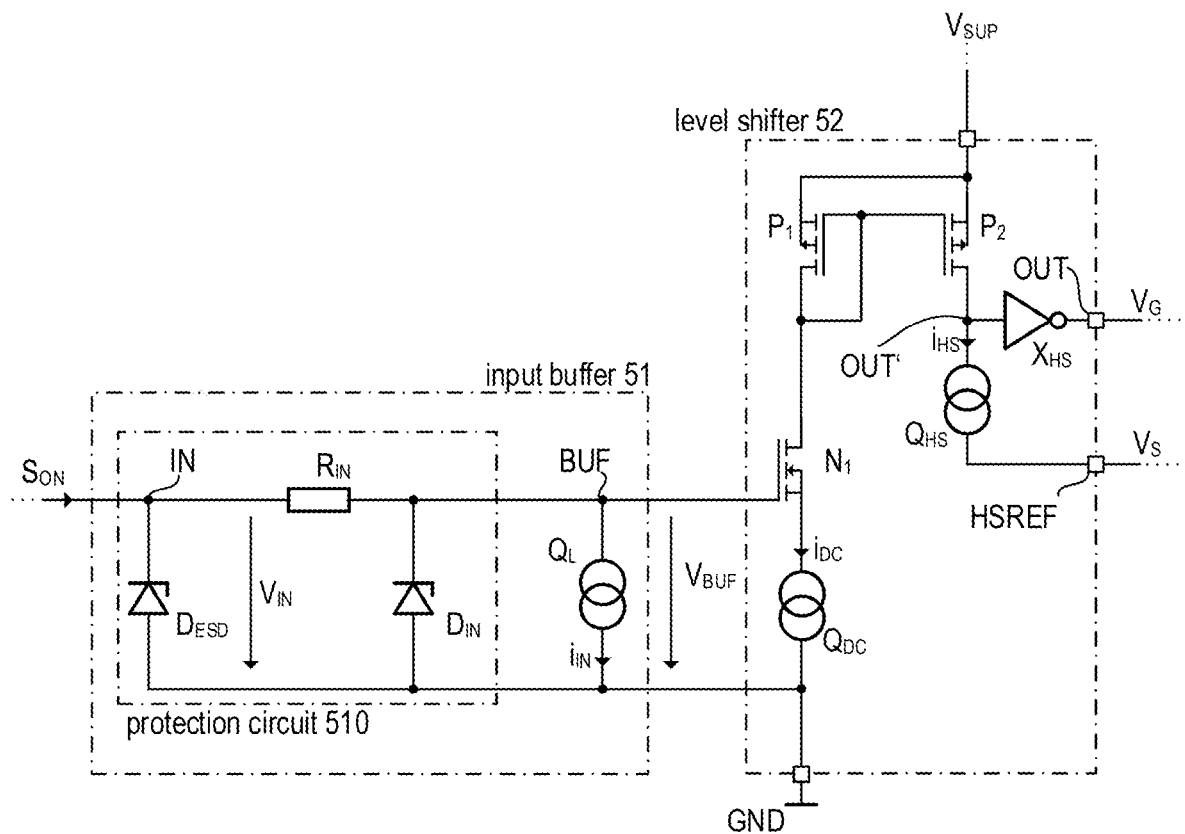
FIG. 6 shows one common implementation of the driver circuit of FIG. 5.

FIG. 6 illustrates one exemplary implementation of a driver circuit composed of an input buffer 51 and a level-shifter 52. The signal $S_{ON}$ (e.g. having an input voltage level $V_{IN}$) is supplied to the input buffer at an input node IN. To protect the driver circuit from over-voltages (e.g. due to an electrostatic discharge, ESD) the input buffer may include a protection circuit 510 coupled between the input node IN and ground. To drain high currents (so-called ESD pulses) due to an electrostatic discharge (ESD) the protection circuit 510 may include a Zener diode $D_{ESD}$ which is connected between input node IN and ground GND. To limit the input current, the protection circuit 510 may include a resistor $R_{IN}$, which is connected between the input node IN and an output node BUF of the input buffer 51. A further Zener diode $D_{IN}$ may be connected between the output node BUF and ground to limit the level of the output voltage $V_{BUF}$ provided at the output node BUF, which is supplied as input signal to the level shifter 52. Accordingly, the output voltage $V_{BUF}$ is limited to the Zener voltage of the Zener diode $D_{IN}$ (e.g. 3.3 V). A pull-down circuit such as a current source $Q_L$ is also coupled between the output node BUF and ground GND so that the output voltage VBUF is pulled towards ground potential unless the level of the input voltage $V_{IN}$ is actively set to a high logic level. A simple resistor may be used as a pull-down circuit element instead of a current source.

In the example of FIG. 6, the level shifter 52 includes a current source $Q_{DC}$ connected between ground GND and an the input current path (i.e. load current path of p-channel transistor P1) of a current mirror composed of transistors P1 and P2, wherein an electronic switch, which may be implemented as a n-channel MOS transistor $N_1$, is connected between the current source $Q_{DC}$ and the current mirror. Dependent on the switching state (on or off) of the transistor $N_1$ the input current of the current mirror is either equal to the current $i_{DC}$ generated by the current source $Q_{DC}$ or zero, wherein the transistor $N_1$ is switched on and off in accordance with the output voltage $V_{BUF}$ of the input buffer 51. When transistor $N_1$ is on, the p-channel transistor P1 "sees" the load current $i_{DC}$ and, consequently, the p-channel transistor P2 (in the output current path of the current mirror) operates as a current source trying to generate a constant current $i_{DC}$, When transistor $N_1$ is off, the p-channel transistor P1 "sees" a load current of zero and, consequently, the p-channel transistors P1 and P2 assume an off state and thus behave similar to a very high resistor.

A further current source $Q_{HS}$ is connected between the output current path of the current mirror (i.e. load current path of p-channel transistor P2) and a high-side reference node HSREF, which is at the floating reference potential for high-side signals (e.g. the source potential of electronic switch 2 in case of a MOSFET, see FIG. 5). The current source $Q_{HS}$ is configured to generate a current his lower than the current $i_{DC}$. The common circuit node of p-channel transistor P2 and current source $Q_{HS}$ is labelled OUT'. The output node OUT of the level shifter is coupled to the node OUT' via an inverter $X_{HS}$ so that the signal level at the output node OUT is inverse to the signal level at node OUT'. When transistor $N_1$ is off and the p-channel transistor P1 "sees" a load current of zero, the signal level at node OUT' will be pulled towards (approximately) the supply voltage $V_{SUP}$ thus producing a high level at node OUT' and a low level at output node OUT. When transistor $N_1$ is on and the p-channel transistor P1 "sees" the current $i_{DC}$ as load current, the signal level at node OUT' will be pulled towards (approximately) the reference potential at reference node HSREF, thus producing a low level at node OUT' and a high level at output node OUT. In other words, in the present example the current mirror composed of transistors P1 and P2 is operated as current comparator configured to compare the current in the input current path of the current mirror ($i_{DC}$ or zero) with a reference current $i_{HS}$. In essence, the output voltage $V_{BUF}$ of the input buffer, for which ground is the reference point, is translated to the voltage $V_G$, for which the floating node HSREF is the reference point.

One can see from FIG. 6, that the input buffer will permanently draw an input current $i_{IN}$ (due to current source $Q_L$) from the input node IN, while supplied with a high input voltage level $V_{IN}$. Furthermore, the level shifter will permanently draw a load current of $2 \cdot i_{DC}$, while supplied with a high voltage level $V_{SUP}$. This current consumption is undesired. Even if the current consumption of a single driver circuit for a single electronic fuse may be small, the total current consumption of a high number of electronic fuses, which may be used in an automobile, may significantly load the automobile battery. Furthermore, if the input signal $S_{ON}$ (voltage $V_{IN}$) is not actively maintained at a high level, while the electronic switch 2 is on, the current source $Q_L$ will pull the level of the input buffer output voltage $V_{BUF}$ towards a low level thus switching the electronic switch 2 off. The input signal $S_{ON}$ (voltage $V_{IN}$) not being actively maintained at a high level, may be caused by a fault in the circuit (e.g. interrupted line L also referred to as "pin loss", see FIG. 1) or by the microcontroller changing into a sleep mode. However, in many application it would be desired that the electronic switch 2, when operated as an electronic fuse, remains on even when the microcontroller changes into a sleep mode.

Figure 7:
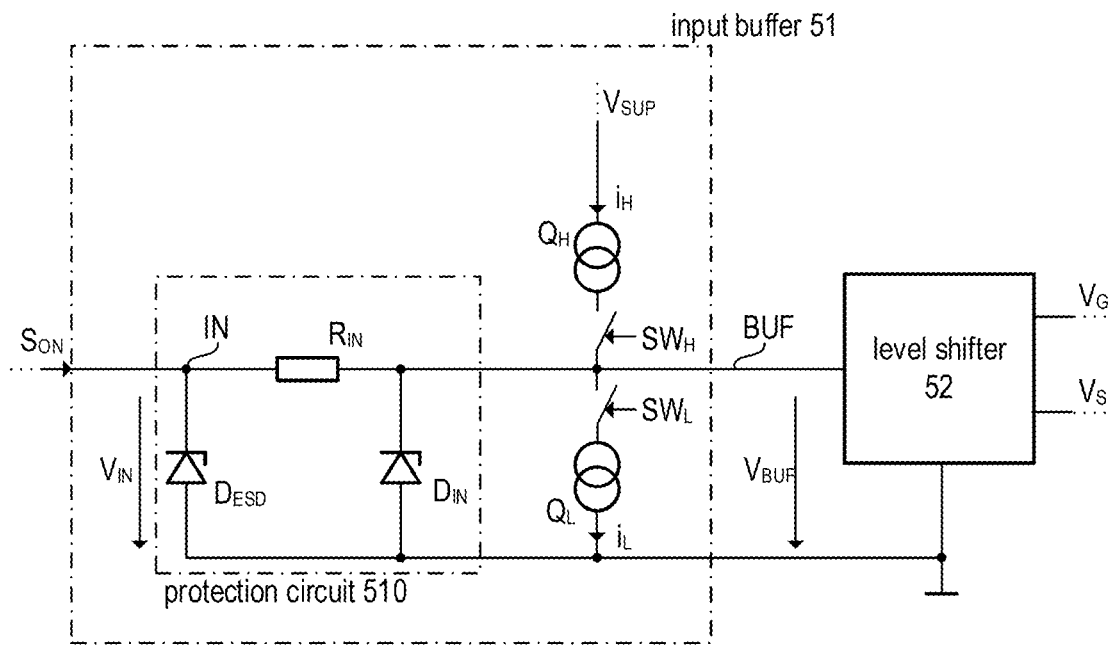
FIG. 7 shows one exemplary implementation of the input buffer according to one embodiment.

FIG. 7 illustrates one exemplary embodiment of an improved input buffer 51 to be used in a driver circuit 5 (see FIG. 5). As the previous example, the input buffer may include a protection circuit 510, which has already been explained with reference to FIG. 6. However, dependent on the application a different (e.g. more complex) protection circuit may be used or the protection circuit may be omitted at all. It is noted that the protection circuit does not affect the level of the input signal $S_{ON}$ (i.e. voltage $V_{IN}$ in the present example) if the input voltage level is within the specified limits (e.g. between 0V and 3.3 V). However, the pull-down circuit used in the previous example of FIG. 6 (current source $Q_L$) is supplemented with a pull-up circuit, wherein both, pull-down circuit and pull-up circuit, can be activated and deactivated using electronically controllable switches $SW_L$ and $SW_H$, respectively.

In the present embodiment, pull-down circuit and pull-up circuit are represented by current sources $Q_L$ and $Q_H$, respectively. The current source $Q_L$ is connected between ground node GND and input buffer output node BUF, and current source $Q_H$ is connected between input buffer output node BUF and a supply node providing a supply voltage $V_{SUP}$. The voltage level of the supply voltage $V_{SUP}$ thus determines the high-level of the input buffer output voltage $V_{BUF}$. It is noted that—although the current sources $Q_H$, $Q_L$ provide substantially constant currents $i_H$, $i_L$ while pulling the voltage $V_{BUF}$ towards supply voltage $V_{SUP}$ or ground—the currents $i_H$, $i_L$ will drop to almost zero as soon the voltage $V_{BUF}$ reaches the desired high or low level, respectively, because the voltage drop across the current source will reach approximately zero. The pull-down circuit and pull-up circuit (current sources $Q_H$, $Q_L$) are activated and deactivated by the switches $SW_H$ and $SW_L$, respectively, dependent on the actual level of the voltage $V_{BUF}$. Accordingly, the pull-down circuit (current source $Q_L$) is active and the pull-up circuit (current source $Q_L$) is inactive as long as the voltage $V_{BUF}$ is below a threshold $V_{TH}$ ($V_{BUF} < V_{TH}$). Conversely, the pull-down circuit (current source $Q_L$) is inactive and the pull-up circuit (current source $Q_H$) is active as soon as the voltage $V_{BUF}$ reaches or exceeds the threshold $V_{TH}$ ($V_{BUF} \geq V_{TH}$). In the example of FIG. 7, the driver 5 will maintain a high-level output signal (voltage $V_G$) even if the signal path between the input node IN and an external circuit providing the input signal $S_{IN}$ (see FIG. 1, wire/line L) is broken or if the input signal $S_{ON}$ disappears for any other reason (e.g. because the microcontroller generating the input signal $S_{IN}$ changes into a sleep mode, see FIG. 1). Consequently, the electronic fuse F, i.e. the electronic switch, will not disconnect the load from the supply unless the electronic switch 2 is actively switched off, e.g. by actively setting the input signal $S_{IN}$ (see FIG. 1) to a low level by the microcontroller.

Figure 8:
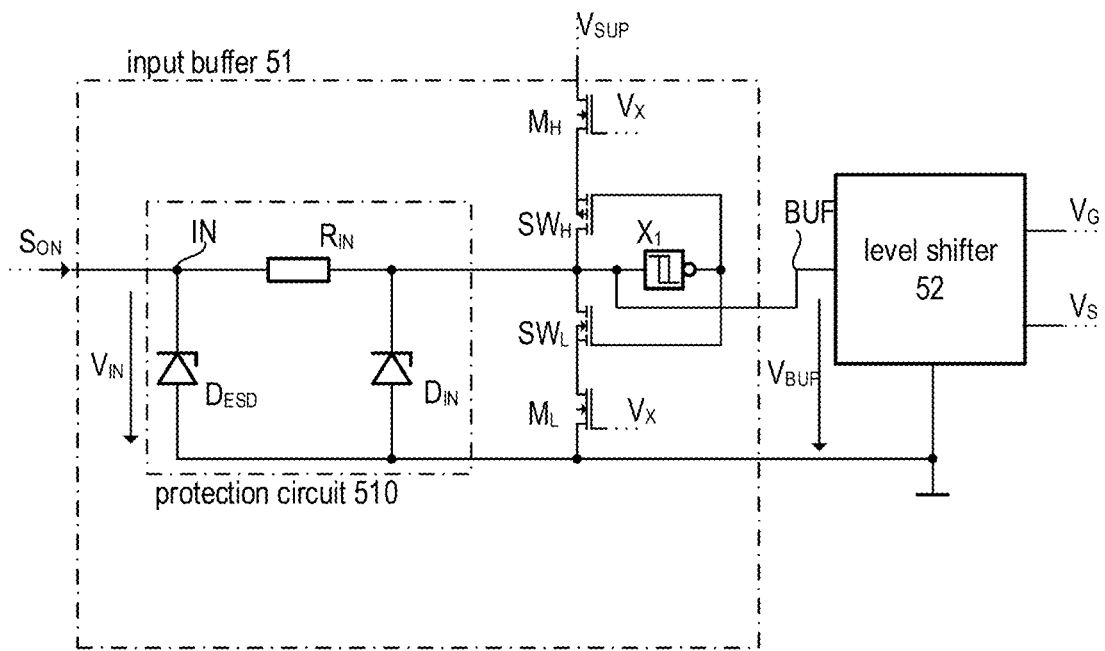
FIG. 8 shows the example of FIG. 7 in more detail.

The example of FIG. 8 illustrates one exemplary implementation of the general example of FIG. 7. In the present embodiment the pull-down circuit (current source $Q_L$) and the pull-up circuit (current source $Q_H$) are implemented using n-channel depletion MOS transistors $M_L$ and $M_H$, respectively. The gate electrodes of the MOS transistors $M_L$ and $M_H$ may be supplied with a constant bias voltage $V_X$. Dependent on the semiconductor technology used for manufacturing the integrated circuits, the bias voltage $V_X$ may be zero. That is, the gate electrodes as well as the body contacts of the MOS transistors $M_L$ and $M_H$ may be connected to ground. In this case the voltage between gate and body is constantly zero and thus the drain currents $i_H$ and $i_L$ of the MOS transistors $M_L$ and $M_H$ are also substantially constant as long as the drain-source voltages are high enough that the MOS transistors $M_L$ and $M_H$ operate in the saturation region. However, if the voltage $V_{BUF}$ approaches zero (when pull-down circuit is active) or the supply voltage $V_{SUP}$ (when pull-up circuit is active), the drain-source voltages will decrease until MOS transistors $M_L$ and $M_H$, respectively, operate in the linear region. The drain currents $i_L$ and $i_L$ will decrease accordingly and approach zero. As a consequence, (almost) no current will be consumed in both switching stages (on and off). The current sources $Q_L$ and $Q_H$ (when implemented as MOS transistors $M_L$ and $M_H$, respectively) will only be active in the transition phases between $V_{BUF}$=0V (switch off) and $V_{BUS}$=$V_{SUP}$ (switch on).

According to the example of FIG. 8, the switches $SW_H$ and $SW_L$ may be implemented using p-channel and n-channel enhancement MOS transistors, wherein the switch $SW_H$ in the pull-up circuit is implemented as a p-channel enhancement MOS transistor and the switch $SW_L$ in the pull-down circuit is implemented as an n-channel enhancement MOS transistor. The gate electrodes of the switches are connected to the output of an inverter $X_1$, which generates a voltage level representing the inverse of the signal level of $V_{SUP}$. Accordingly, the pull-down circuit is active (switch $SW_L$ is on and switch $SW_H$ off) when the level of the voltage $V_{SUP}$ is below a threshold $V_{THL}$ and thus classified as "low level". Similarly, the pull-up circuit is active (switch $SW_L$ is off and switch $SW_H$ on) when the level of the voltage $V_{SUP}$ is below a threshold $V_{THH}$ and thus classified as "high level". Dependent on the implementation the threshold values $V_{THL}$ and $V_{THH}$ may be identical. In case the inverter $X_1$ has a hysteresis, the threshold level $V_{THH}$ is greater than the $V_{THL}$, the hysteresis may be useful to prevent an undesired toggling of the switches $SW_H$ and $SW_L$.

Figure 9:
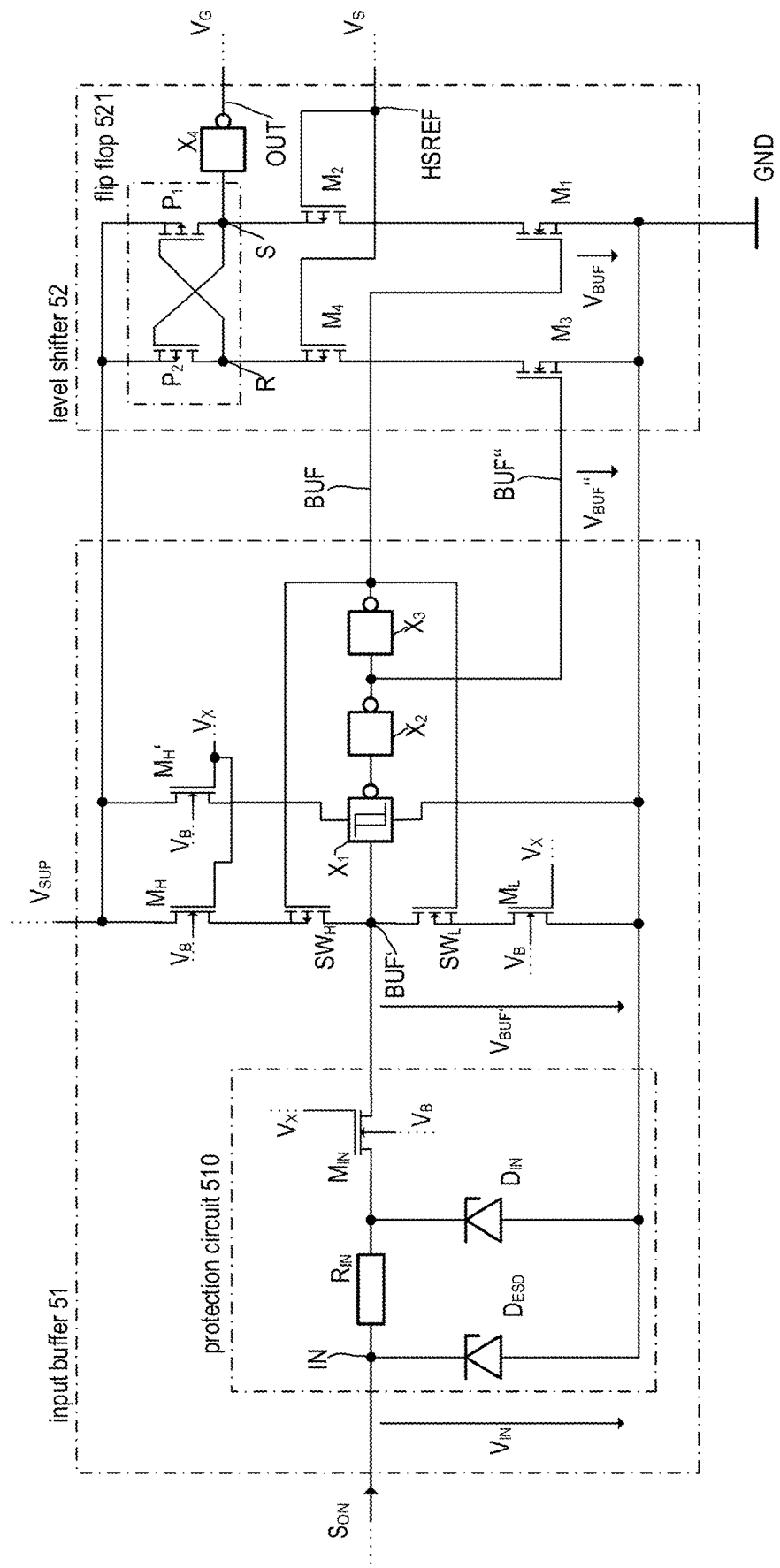
FIG. 9 shows one exemplary implementation of the level shifter according to one embodiment.

FIG. 9 illustrates a further exemplary implementation of the input buffer 51 as well an exemplary implementation of the level-shifter 52 which is also designed to limit current consumption to the transition phases while switching from a high level to a low level of the input buffer output voltage $V_{BUF}$ and vice versa. The protection circuit 510 included in the input buffer 51 is essentially the same as in the previous examples apart from an additional n-channel depletion MOS transistor $M_{IN}$ whose drain-source current path is coupled between the input node IN and the pull-up and pull-down circuits. The body contact (bulk contact) of transistor $M_{IN}$ may be connected to the source electrode or supplied with a reference voltage $V_B$ that may be set to zero (i.e. the body contact may be connected to ground). The gate electrode of transistor $M_{IN}$ may be supplied with a bias voltage $V_X$, which may also be zero (i.e. ground potential). The values of $V_X$ and $V_B$ depend on the semiconductor technology used to implement the integrated circuit. In one embodiment the body contact and the gate electrode are both connected to ground potential.

When operating in the linear region, the MOS transistor $M_{IN}$ acts as an additional resistor, in addition to input resistor $R_{IN}$. When the voltage level of the input signal $S_{ON}$ is too high, the MOS transistor $M_{IN}$ will operate in its saturation region thus effectively limiting the high level of the voltage signal $V_{BUF}'$ to a value that depends on the bias voltage $V_X$. The output voltage of the protection circuit 510 is denoted as $V_{BUF}'$ (voltage between node BUF' and ground). During normal operation, the voltage $V_{BUF}'$ follows the voltage $V_{IN}$. However, the voltage $V_{IN}$ may have a high-level greater than the high-level of the voltage $V_{BUF}'$ (due to the limitation accomplished by transistor $M_{IN}$).

In the example of FIG. 9, the pull-up circuit and the pull-down circuit are implemented in the same way as is in the previous example of FIG. 8. Accordingly, the pull-up circuit may be composed of n-channel depletion MOS transistor $M_H$ and semiconductor switch $SW_H$ configured to activate and deactivate the pull-up circuit, wherein transistor $M_H$ and switch $SW_H$ are connected in series between circuit node BUF' and a supply node at which the supply voltage $V_{SUP}$ is provided. Similarly, the pull-down circuit may be composed of n-channel depletion MOS transistor $M_L$ and semiconductor switch $SW_L$ configured to activate and deactivate the pull-up circuit, wherein transistor $M_L$ and switch $SW_L$ are connected in series between circuit node BUF' and ground. Analogously to the previous example, the switches $SW_L$ and $SW_H$ activate either the pull-down-circuit or the pull-up circuit dependent on whether the voltage $V_{BUF}$ is at a high level or at a low level. The body contacts and the gate electrodes may be supplied with reference voltage $V_B$ and bias voltage $V_X$, respectively, in the same manner body contact and gate electrode of transistor $M_{IN}$. It is understood that the reference voltage $V_B$ applied to the body region of the n-channel depletion MOS transistor $M_H$ has to be lower than the voltage level $V_E$ at the source electrode of the transistor $M_H$. Accordingly, the voltage $V_B$ may be, for example, set to 0V (e.g. by connecting the gate electrode and the body region of transistor $M_H$ to ground).

As shown in FIG. 9 three inverters $X_1$, $X_2$, $X_3$ are connected to node BUF' downstream thereto, wherein the circuit node at the output of the second inverter $X_2$ is denoted as BUF" and the circuit node at the output of the third inverter $X_3$ is denoted as BUF. The first inverter $X_1$ is illustrated in more detail. Accordingly, the first inverter $X_1$ is a CMOS inverter, wherein a further n-channel depletion MOS transistor $M_H'$ is connected between the supply node providing supply voltage $V_{SUP}$ and the CMOS inverter. The transistor $M_H'$ is employed to provide a substantially constant voltage (as supply voltage) to the CMOS inverter $X_1$. Body region and gate electrode of transistor $M_H'$ may be supplied with reference voltage $V_B$ and bias voltage $V_X$, respectively, in the same manner body contact and gate electrode of transistors $M_H$ and $M_{IN}$. Basically, the inverters $X_1$ and $X_2$ form a buffer that provides a defined high level (voltage $V_{BUF}"$ at node BUF") when the voltage $V_{BUF}"$ exceeds a voltage threshold $V_{THH}$ (high-threshold) and a defined low level, when the voltage $V_{BUF}"$ falls below a voltage threshold $V_{THL}$ (low-threshold). The third inverter inverts the voltage level of $V_{BUF}$ and provides the inverse voltage signal $V_{BUF}$ at node BUF. The voltage $V_{BUF}$ is supplied to the control electrodes (gate electrodes) of the semiconductor switches $SW_H$ and $SW_L$, so that switch $SW_H$ is on (and switch $SW_L$ is off) when voltage $V_{BUF}'$ provided by the protection circuit 510 exceeds the high-threshold and switch $SW_L$, is on (and switch $SW_H$ is off) when voltage $V_{BUF}'$ falls below the low-threshold. The voltage $V_{BUF}$ may be regarded as output signal of the input buffer 51, which is supplied to the level shifter 52.

According to the example of FIG. 9, the level shifter 52 includes a flip-flop circuit 521 configured to store the signal level (high or low) of the level shifter input signal $V_{BUF}$ (input buffer output signal) and to output an output voltage $V_G$ (with respect to the potential at a high-side reference node HSREF) for driving the electronic switch 2 (see FIG. 5). The flip-flop circuit 521 is connected to the circuit node providing supply voltage $V_{SUP}$ and includes input nodes S (set) and R (reset). The level shifter input signal $V_{BUF}$ is coupled to the input node S to set the flip-flop in response to a high level of the input voltage $V_{SUP}$, the inverted level shifter input signal $V_{BUF}"$ is coupled to the input node R to reset the flip-flop in response to a high level of the inverted input voltage $V_{BUF}"$ (i.e. a low level of the input voltage $V_{BUF}$).

The flip-flop circuit 521 may be composed of two p-channel MOS transistors $P_1$ and $P_2$, wherein the p-channel MOS transistor $P_1$ is connected between the supply node (supply potential $V_{SUP}$) and the input node S and the p-channel MOS transistor $P_2$ is connected between the supply node (supply potential $V_{SUP}$) and the input node R. The source electrodes of the p-channel MOS transistors $P_1$ and $P_2$ are connected to the supply node and the drain electrodes to the input nodes S and R, respectively. The gate electrode of p-channel MOS transistor $P_2$ is connected to the source electrode of p-channel MOS transistor $P_1$ and vice versa. Each one of the input nodes S and R is coupled to ground via a pull-down circuit, which comprises an input transistor and a further transistor. The input transistors may be n-channel MOS transistors (see FIG. 9, transistors $M_1$ and $M_3$) and the further transistors may be p-channel MOS transistors (see FIG. 9, transistors $M_2$ and $M_4$). That is, the load current paths (drain-source current paths) of transistors $M_1$ and $M_2$ are connected in series between ground and input node S or the flip-flop 521, and the load current paths of transistors $M_3$ and $M_4$ are connected in series between ground and input node R or the flip-flop 521. The source electrodes of the transistors $M_2$ and $M_4$ are connected to the input nodes S and R of the flip-flop 521, respectively. The gate electrodes transistors $M_2$ and $M_4$ is connected to the high-side reference node HSREF which receives the reference potential for high-side signals (e.g. the source potential of electronic switch 2 in case of a MOSFET). Basically, the transistors $M_2$ and $M_4$ are operated as source followers and thus they ensure that the potential at the input nodes S and R of the flip-flop does not fall below the high-side reference potential at node HSREF. The sources of input transistors $M_1$ and $M_3$ are connected to ground and their gate electrodes are supplied with the level shifter input voltage $V_{BUF}$ and its inverse $V_{BUF}"$, respectively. An output node OUT is connected to the node S of the flip-flip flop circuit 521 via an inverter $X_4$. However, the output signal may also be tapped at node R without a subsequent level inversion.

For the further explanation, it is assumed that the electronic switch 2 (see FIG. 5) is switched off. In this case, the level shifter input voltage $V_{BUF}$ has a low-level and the inverted voltage signal $V_{BUF}"$ has a high-level. As a consequence, transistor $M_1$ is off and transistor $M_3$ is on, thus pulling the voltage at reset node R of the flip-flop 521 down to the potential (e.g. source potential $V_S$ of electronic switch 2) at the high-side reference node HSREF. As a result, transistor $P_1$ of flip-flop 521 is switched on, which leads to a switch off of transistor $P_2$. The flip-flop 521 is in a reset state. When the level shifter input voltage $V_{BUF}$ changes to a high-level (and thus $V_{BUS}"$ to a low level) the flip-flop 521 is set. Accordingly, transistor $M_3$ is switched off and transistor $M_1$ is switched on, thus pulling the voltage at set node S of the flip-flop 521 down to the potential (e.g. source potential $V_S$ of electronic switch 2) at the high-side reference node HSREF. As a result, transistor $P_2$ of flip-flop 521 is switched on, which leads to a switch-off of transistor $P_1$. The flip-flop 521 is in a set state, in which the output signal (gate voltage $V_G$) is at a high level to switch on the electronic switch 2 (see FIG. 5).

It is noted that the current consumption of the level shifter 52 is practically zero (apart from leakage currents) in a steady state, in which in both current paths (i.e. the current path through transistors $P_1$, $M_4$ and $M_3$ as well as current path through transistors $P_2$, $M_3$ and $M_1$) are blocked by one transistor. That is, when transistor $P_2$ is on, transistor $M_3$ will be off; when transistor $M_3$ is on, transistor $P_2$ will be off. Similarly when transistor $P_1$ is on, transistor $M_1$ will be off; when transistor $M_1$ is on, transistor $P_1$ will be off. Therefore, current is only consumed in the transition phases, i.e. while voltage $V_{SUP}$ changes from a low level to a high level and vice versa.

According to the embodiments illustrated in FIGS. 6 to 9, the input buffer 51 and the level shifter 52 may be designed such that the current consumption is substantially limited to the transition times, i.e. to the time periods, during which the electronic switch is switched on and off. Furthermore, the input buffer 51 is more robust as a pin loss or a controller circuit changing into sleep mode will not cause a switch-off of the electronic switch.

Exemplary embodiments are summarized below. It is, however, emphasized that the following is not an exhaustive enumeration of examples but rather an exemplary summary. The various features of the embodiments may be combines in any way unless explicitly stated otherwise. A first example relates to a driver circuit for an electronic switch is. Accordingly, the driver circuit includes an input buffer with an input node for receiving a buffer input signal, a pull-down circuit coupled to the input node and a ground node, and a pull-up circuit coupled to the input node and a supply node. The driver circuit further includes control circuitry configured to activate either the pull-down circuit or the pull-up circuit. The pull-up circuit is activated when the voltage level of the buffer input signal is above a first threshold, and the pull-down circuit is activated when the voltage level of the buffer input signal is below a second threshold.

According to a second example, the driver circuit according to the first example may further include a protection circuit coupled between the input node and a common node of the pull-up circuit and the pull-down circuit. The protection circuit is configured to protect circuit components downstream thereof from over-current or over-voltage or both.

A third example of the driver circuit substantially corresponds to the first or second example, wherein the pull-down circuit includes a first transistor and a first electronic switch connected in series, and wherein the pull-up circuit includes a second transistor and a second electronic switch connected in series. A fourth example of the driver circuit substantially corresponds to the third example, wherein the first electronic switch is switched on to activate the pull-down circuit, and wherein the second electronic switch is switched on to activate the pull-up circuit. A fifth example of the driver circuit substantially corresponds to the third or the fourth example, wherein the first transistor is a first depletion MOS transistor and wherein the second transistor is a second depletion MOS transistor. A sixth example of the driver circuit substantially corresponds to the fifth example, wherein the gate electrodes of the first and the second depletion MOS transistors are supplied with a constant potential or connected to ground.

According to a seventh example, the driver circuit according to any of the foregoing examples may further include at least one inverter coupled to a common circuit node of the pull-up circuit and the pull-down circuit, wherein the pull-up circuit and the pulldown circuit are activated and deactivated in a mutually exclusive manner in accordance with an output signal of the at least one inverter. An eighth example substantially corresponds to the seventh example, wherein a first one of the at least one inverter has a hysteresis. A ninth example substantially corresponds to any of the foregoing examples, wherein the pull-up circuit and the pulldown circuit are configured to consume substantially no current in a steady state.

According to a tenth example, the driver circuit according to any of the foregoing examples may further include a level shifter supplied with an input signal representing the signal level at a common circuit node of the pull-up circuit and the pull-down circuit. The level shifter includes: a first input transistor receiving the input signal, and a second input transistor receiving an inverted version of the input signal, wherein both, the first input transistor and the second input transistor are coupled between ground and a flip-flop circuit.

An eleventh example substantially corresponds to the tenth example, wherein a third transistor is coupled between the first input transistor and a set input of the flip-flop circuit, and wherein a fourth transistor is coupled between the first input transistor (M3) and a reset input of the flip-flop circuit, and wherein the third transistor and the fourth transistor have control electrodes connected to a high-side reference node, at which a high-side reference potential is applied. A twelfth example substantially corresponds to the eleventh example, wherein the level shifter is configured to provide an output signal with respect to the a high-side reference potential; the output signal has a signal level in accordance with the signal level at the set input or the reset input of the flip-flop circuit.

A thirteenth example relates to a method for driving an electronic switch. Accordingly, the method includes receiving a buffer input signal at an input node of an input buffer; the method further includes pulling the voltage level at an output node of the input buffer up by activating a pull-up circuit, when the voltage level of the buffer input signal is above a first threshold, or pulling the voltage level at an output node of the input buffer down by activating a pull-down circuit, when the voltage level of the buffer input signal is below a second threshold.

A fourteenth example relates to an electronic fuse circuit. Accordingly, the electronic fuse circuit includes an electronic switch operably coupled to a load and configured to connect and disconnect the load from a power supply. The electronic fuse circuit further includes a driver circuit coupled to a control electrode of the electronic switch. The driver circuit may be implemented in accordance with any of the forgoing examples.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

We claim:

1. A driver circuit for an electronic switch, the driver circuit comprising:
   an input buffer comprising an input node for receiving a buffer input signal;
   a pull-down circuit coupled to the input node and a ground node;
   a pull-up circuit coupled to the input node and a supply node;
   at least one inverter coupled to a common circuit node of the pull-up circuit and the pull-down circuit, wherein the pull-up circuit and the pull-down circuit are activated and deactivated in a mutually exclusive manner in accordance with an output signal of the at least one inverter; and
   a control circuitry configured to activate either the pull-down circuit or the pull-up circuit, wherein the pull-up circuit is activated when a voltage level of the buffer input signal is above a first threshold, wherein the pull-down circuit is activated when the voltage level of the buffer input signal is below a second threshold.

2. The driver circuit of claim 1, further comprising a protection circuit coupled between the input node and the common circuit node of the pull-up circuit and the pull-down circuit, the protection circuit being configured to protect circuit components downstream thereof from over-current or over-voltage or both.

3. The driver circuit of claim 1,
   wherein the pull-down circuit includes a first transistor and a first electronic switch connected in series; and
   wherein the pull-up circuit includes a second transistor and a second electronic switch connected in series.

4. The driver circuit of claim 3,
   wherein the first electronic switch is switched on to activate the pull-down circuit, and
   wherein the second electronic switch is switched on to activate the pull-up circuit.

5. The driver circuit of claim 3, wherein the first transistor is a first depletion MOS transistor and wherein the second transistor is a second depletion MOS transistor.

6. The driver circuit of claim 5, wherein gate electrodes of the first and the second depletion MOS transistors are supplied with a constant potential or connected to ground.

7. The driver circuit of claim 1, wherein a first inverter of the at least one inverter has a hysteresis.

8. The driver circuit of claim 1, wherein the pull-up circuit and the pulldown circuit are configured to consume substantially no current in a steady state.

9. The driver circuit of claim 1, further comprising:
   a level shifter supplied with an input signal representing the signal level at the common circuit node of the pull-up circuit and the pull-down circuit, wherein the level shifter comprises:
   a first input transistor receiving the input signal, and
   a second input transistor receiving an inverted version of the input signal,
   wherein both, the first input transistor and the second input transistor are coupled between ground and a flip-flop circuit.

10. The driver circuit of claim 9, wherein a third transistor is coupled between the second input transistor and a set input of the flip-flop circuit, and wherein a fourth transistor is coupled between the first input transistor and a reset input of the flip-flop circuit, and wherein the third transistor and the fourth transistor have control electrodes connected to a high-side reference node, at which a high-side reference potential is applied.

11. The driver circuit of claim 10, wherein the level shifter is configured to provide an output signal with respect to the high-side reference potential, the output signal having a signal level in accordance with the signal level at the set input or the reset input of the flip-flop circuit.

12. A method for driving an electronic switch, the method comprising:

receiving a buffer input signal at an input node of an input buffer;

pulling a voltage level at an output node of the input buffer up by activating a pull-up circuit coupled to the input node and a supply node, when a voltage level of the buffer input signal is above a first threshold, or pulling the voltage level at the output node of the input buffer down by activating a pull-down circuit coupled to the input node and a ground node, when the voltage level of the buffer input signal is below a second threshold; and activating and deactivating the pull-up circuit and the pull-down circuit in a mutually exclusive manner in accordance with an output signal of at least one inverter coupled to a common circuit node of the pull-up circuit and the pull-down circuit.

13. An electronic fuse circuit comprising:

an electronic switch operably coupled to a load and configured to connect and disconnect the load from a power supply; and a driver circuit coupled to a control electrode of the electronic switch and comprising:

an input buffer comprising an input node for receiving a buffer input signal;

a pull-down circuit coupled to the input node and a ground node;

a pull-up circuit coupled to the input node and a supply node;

at least one inverter coupled to a common circuit node of the pull-up circuit and the pull-down circuit, wherein the pull-up circuit and the pull-down circuit are activated and deactivated in a mutually exclusive manner in accordance with an output signal of the at least one inverter; and a control circuitry configured to activate either the pull-down circuit or the pull-up circuit, wherein the pull-up circuit is activated when a voltage level of the buffer input signal is above a first threshold, wherein the pull-down circuit is activated when the voltage level of the buffer input signal is below a second threshold.

14. The electronic fuse circuit of claim 13 further comprising a protection circuit coupled between the input node and the common circuit node of the pull-up circuit and the pull-down circuit, the protection circuit being configured to protect circuit components downstream thereof from over-current or over-voltage or both.

15. The electronic fuse circuit of claim 13, wherein the pull-down circuit includes a first transistor and a first electronic switch connected in series; and wherein the pull-up circuit includes a second transistor and a second electronic switch connected in series.

16. The electronic fuse circuit of claim 15, wherein the first electronic switch is switched on to activate the pull-down circuit, and wherein the second electronic switch is switched on to activate the pull-up circuit.

17. The electronic fuse circuit of claim 15, wherein the first transistor is a first depletion MOS transistor and wherein the second transistor is a second depletion MOS transistor.

18. The electronic fuse circuit of claim 17, wherein gate electrodes of the first and the second depletion MOS transistors are supplied with a constant potential or connected to ground.

19. The electronic fuse circuit of claim 13, wherein a first inverter of the at least one inverter has a hysteresis.

20. A driver circuit for an electronic switch, the driver circuit comprising:

an input buffer comprising an input node for receiving a buffer input signal;

a pull-down circuit coupled to the input node and a ground node;

a pull-up circuit coupled to the input node and a supply node;

a control circuitry configured to activate either the pull-down circuit or the pull-up circuit, wherein the pull-up circuit is activated when a voltage level of the buffer input signal is above a first threshold, wherein the pull-down circuit is activated when the voltage level of the buffer input signal is below a second threshold; and a level shifter supplied with an input signal representing the signal level at a common circuit node of the pull-up circuit and the pull-down circuit, wherein the level shifter comprises:

a first input transistor receiving the input signal, and a second input transistor receiving an inverted version of the input signal, wherein both, the first input transistor and the second input transistor are coupled between ground and a flip-flop circuit.

21. The driver circuit of claim 20, wherein a third transistor is coupled between the second input transistor and a set input of the flip-flop circuit, and wherein a fourth transistor is coupled between the first input transistor and a reset input of the flip-flop circuit, and wherein the third transistor and the fourth transistor have control electrodes connected to a high-side reference node, at which a high-side reference potential is applied.

* * * * *